(12) United States Patent
Guskov

(10) Patent No.: US 8,724,669 B2
(45) Date of Patent: May 13, 2014

(54) SYSTEM FOR DRIVING PULSED LASER DIODE PUMP

(75) Inventor: Sergey Guskov, Burbach (DE)

(73) Assignee: IPG Photonics Corporation, Oxford, MA (US)

( * ) Notice: Subject to any disclaimer, the term of this patent is extended or adjusted under 35 U.S.C. 154(b) by 0 days.

(21) Appl. No.: 13/983,739

(22) PCT Filed: Feb. 3, 2011

(86) PCT No.: PCT/US2011/023566
§ 371 (c)(1),
(2), (4) Date: Aug. 5, 2013

(87) PCT Pub. No.: WO2012/105976
PCT Pub. Date: Aug. 9, 2012

(65) Prior Publication Data
US 2013/0308668 A1    Nov. 21, 2013

(51) Int. Cl.
*H01S 3/00* (2006.01)
(52) U.S. Cl.
USPC .......................... 372/38.04; 372/38.01; 372/6
(58) Field of Classification Search
USPC ........................ 372/38.04, 38.01, 6
See application file for complete search history.

(56) References Cited

U.S. PATENT DOCUMENTS

| | | |
|---|---|---|
| 5,048,033 A | 9/1991 | Donahue et al. |
| 2007/0280314 A1* | 12/2007 | Keh et al. .................. 372/38.02 |
| 2010/0091807 A1* | 4/2010 | Deppe et al. ............... 372/38.04 |
| 2011/0085576 A1* | 4/2011 | Crawford et al. .......... 372/38.07 |

FOREIGN PATENT DOCUMENTS

| | | |
|---|---|---|
| JP | 06-315279 A | 11/1994 |
| JP | 09-246634 A | 9/1997 |
| KR | 10-0317390 A | 12/2000 |

OTHER PUBLICATIONS

International Search Report, dated Aug. 15, 2013.

* cited by examiner

*Primary Examiner* — Kinam Park
(74) *Attorney, Agent, or Firm* — Yuri Kateshow, Esq.; Tim King, Esq.

(57) ABSTRACT

A power supply for laser systems is configured with a DC power source having an output source voltage, an energy accumulator operatively connected to the output of the DC power source, and a pump. Coupled between the accumulator and source is a first DC to DC stage with at least one switched-mode power converter which is operative to charge the accumulator with voltage. The charged voltage may be same or different from the source voltage. The power supply further includes a second DC to DC stage with at least one switched-mode power converter coupled between the accumulator and pump and operative to discharge accumulator to the same or different output voltage. The DC to DC converters are configured so that current pulses at the input of the pump each have a peak value greater than the power source current.

19 Claims, 3 Drawing Sheets

SYSTEM FOR DRIVING PULSED LASER DIODE PUMP

CROSS-REFERENCE TO RELATED APPLICATION

This application is a National Phase Application of PCT/US2011/023566 filed on Feb. 3, 2011

BACKGROUND OF THE DISCLOSURE

1. Field of the Disclosure

The present disclosure relates to laser systems configured with a power supply which is operative to generate electrical pulses each characterized by a high peak current rating which results in long, powerful optical pulses.

2. Discussion of Known Prior Art

A laser's pumping scheme can be either continuous (cw) or pulsed. The pulsed pumping exclusively operates in brief, discrete time intervals. Traditional solid-state lasers utilize crystals configured to accumulate the energy by providing an excessive inversion for generating high power optical pulses of up to several J. Fiber lasers, in contrast to solid-state lasers, are poorly suited for storing the energy because of a relatively small core of rare-earth doped fibers.

One of the alternative methods of radiating high-energy pulses by fiber lasers includes pumping the laser material with an optical source, such as laser diodes, which are themselves pulsed. This method may impose power scaling limitations on a power source, which is designed to work in a continuous regime, since the electrical pulses are characterized by high current substantially exceeding that one in the continuous regime. If the electrical pulse is long enough, which is desirable, the overcurrent protection system limits the output current, and the power source is not able to provide the required peak power. Such an interruption leads to an inadequate performance of power source operating in the pulsed regime.

FIG. 1 illustrates an attempt to somewhat minimize the above-discussed problem by coupling a capacitor "C" across the output of a power supply source. Due to a high current pulse, the voltage across the capacitor "C" slightly drops. The power source begins to compensate for the drop but is soon limited by an overcurrent circuitry operative to prevent the source overload. Subsequently, the source is either tuned off or continues to work with the limited current allowed by the design of the source.

Powerful supply sources could somewhat alleviate the disclosed problem. However, powerful sources do not provide a viable solution because the known configurations are neither compact nor cost-efficient.

A need therefore exists for a laser system with a power supply source that can handle the peak current, yet provide the normal (non-peak) operating power.

SUMMARY OF THE DISCLOSURE

The disclosed structure meets this need. In particular, the disclosed system is operative to generate high-energy electrical pulses at the input of a laser pump causing high energy light pulses at the output of a fiber laser system, and a quasi-constant load at the output of a power source.

The system includes a power source and a laser diode pump unit operative to radiate light pulses which are coupled into a laser unit. Preferably, the latter is configured as a fiber laser system, but may have other known configurations, and structured as a pulsed high power fiber laser system.

The system is further configured with an energy accumulator and a multi-stage DC-DC power converter having a first, charging stage which is located between the source and accumulator and operative to charge the latter, and a second, discharging stage which is coupled to the accumulator and pump and operative to discharge the former. Due to the stored energy on the accumulator, the converter is operative to controllably generate the desired current signal at the input of the laser pump. On the other hand, the load on the power source does not exceed the current threshold of the source. As a result, the disclosed configuration eliminates a need for oversized sources.

BRIEF DESCRIPTION OF THE DRAWINGS

The above and other features and advantages of the disclosed system are explained in detail hereinbelow in conjunction with the following drawings, in which.

SPECIFIC DESCRIPTION

Figure 1:
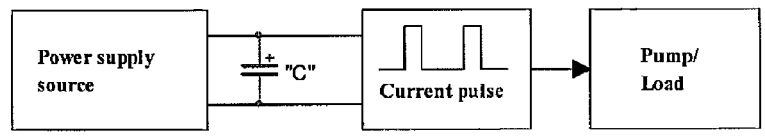
FIG. 1 is a schematic of one of the known power sources.

Reference will now be made in detail to the disclosed system and method. Wherever possible, same or similar reference numerals are used in the drawings and the description to refer to the same or like parts. The drawings are highly diagrammatic and are far from precise scale. For purposes of convenience and clarity only, the terms "connect," "couple," and similar terms do not necessarily denote direct and immediate connections, but also include connections through mediate elements or devices.

Figure 2:
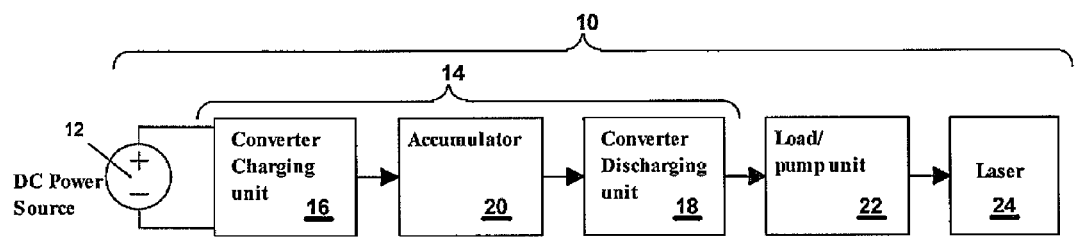
FIG. 2 is a diagrammatic view of the disclosed high power laser system.

Referring to FIG. 2, a fiber laser system 10 includes a DC power source 12 generating a source voltage coupled to a DC-DC converter assembly 14 which includes an accumulator 20, at least one charging stage 16 and at least one discharging stage 18 all electrically coupled to one another. The DC source 12 may or may not be continuously coupled to charging stage 16. In either case, the charging stage 16 operates until accumulator 20 is fully charged.

The discharging stage 18 extracts energy from accumulator 20 only during a pulse duration. The pump 22 includes one or more laser diodes which each are a current control device. The disclosed topography allows for high peak power light pulses generated by pump unit 22 and therefore laser system 24 while shielding power source 12 from being overloaded.

To have high energy pulses at the input of pump unit 22 and therefore high power optical pulses at the output of laser system 24, the energy E extracted from accumulator 20 during the discharge should be as high as possible. The energy E may be determine as $E=C(Vc_1-Vc_2)Vcav$, where C is the capacitance of accumulator 20, $Vc_1$ and $Vc_2$ are respective voltages across the accumulator at the beginning and end of the discharge pulse, and Vcav is a mean value of voltage at the accumulator during the pulse. Accordingly, the higher the mean value of voltage and/or the higher the voltage difference, the higher the energy of accumulator 20.

Figure 3:
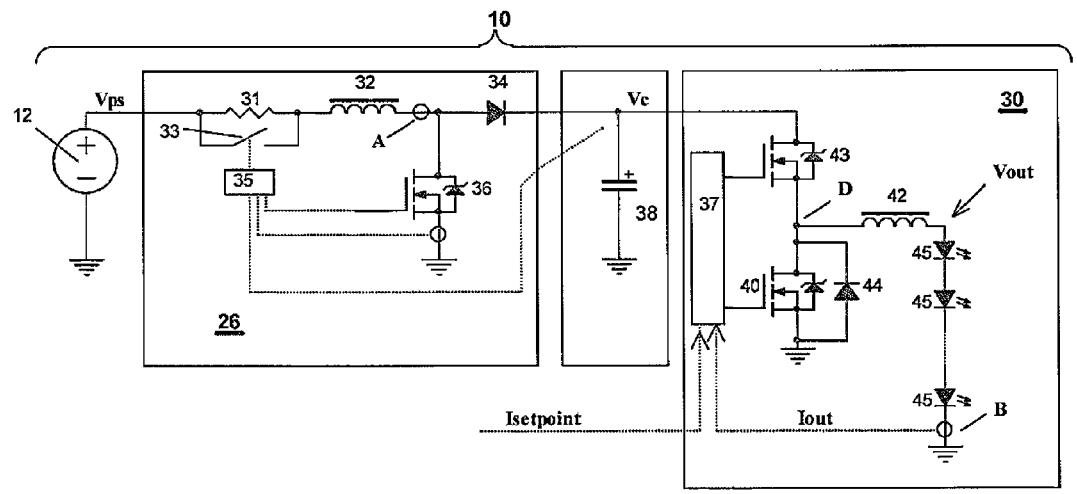
FIG. 3 is a schematic of the disclosed laser system configured in accordance with one embodiment.

FIG. 3 illustrates one of the modifications of one of the embodiments of the disclosed system in which a capacitor 38 functions as an energy accumulator. In addition to the capacitor, system 10 is configured with power source 12, step-up converter 26 constituting charging stage 16, step-down converter 30 constituting discharging stage 18, and laser diodes 45.

Figure 4:
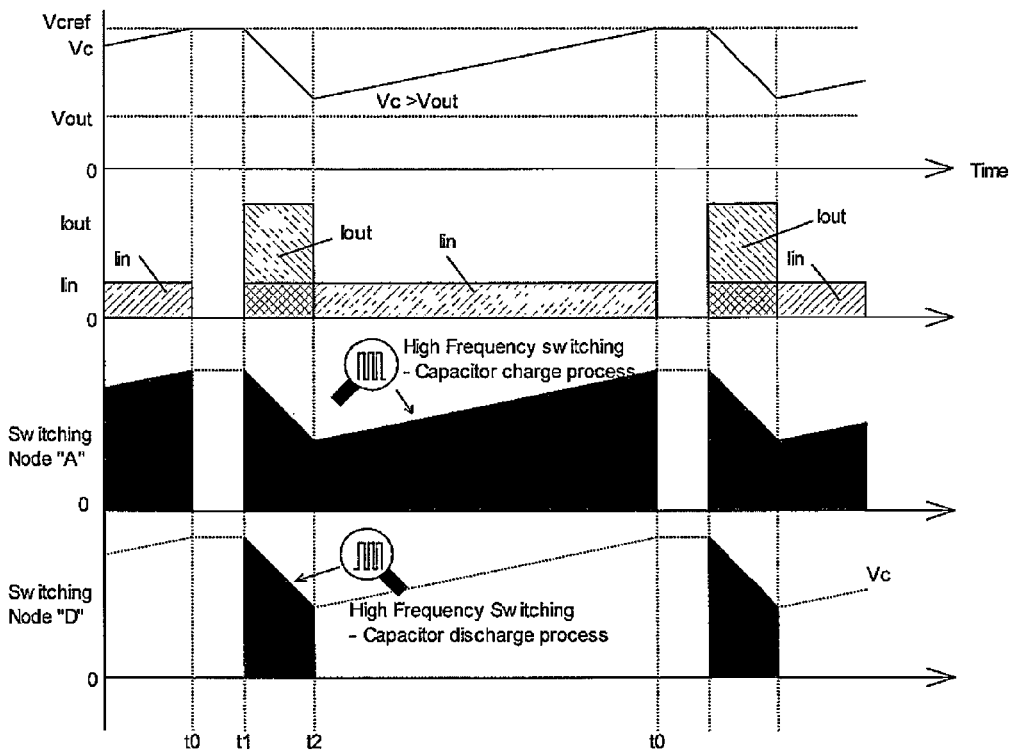
FIG. 4 illustrates waveforms of current and voltage in the system of FIG. 3.

Referring to FIG. 4 in addition to FIG. 3, as known to those skilled in the art, step-up converter 26, based on the boost topology, is operative to increase an input DC voltage Vps of power source 12 to a higher DC voltage Vout across capacitor 38 and further maintain the latter. Given only as a non-limiting example, step-up converter 26 includes an inductor 32, a low-side switch 36 such as a MOSFET, and a high-side switch 34 configured as a diode or MOSFET. When low-side switch 36 is ON, the inductor current is increased; otherwise, the only path available to the inductor current is through high-side switch 34 and capacitor 38. As a result, the energy, accumulated during the ON period of low-side switch 36 is transferred into the capacitor. The high frequency operation of the switches results in the application of the limited charge current to capacitor 38 until voltage Vc corresponds to a reference value at the end of charging period. Thereafter, low-side switch 36 stays OFF as long as capacitor 38 remains fully charged. The peak current of low-side switch 36 and, therefore, input current Iin at point A of FIGS. 3 and 4 kept below the maximum current of the power supply by means of an appropriate duty cycle control. All of the above disclosed functions of switch 36 are monitored and controlled at the input side by a controller 35. In summary, regardless of the concrete configuration of step-up converter 26, the current Iin extracted from source 12 is limited.

The step-down DC to DC converter 30 may be based on the buck topology. An exemplary schematic of converter 30, as shown, is configured as a buck converter including a high-side switch 43, inductor 42, diode 44 and an optional low-side switch 40. The discharging stage 16 includes step-down converter 30, for example, and operates as follows. The current Iout flowing through point B and the pump diodes during a τ period ($t_1-t_2$) of FIG. 4 is continuously monitored by controller 37 and compared to the preset current Isetpoint which is nothing else but the desired form of current Iout (FIG. 4) on pump diodes 45. If the measured current Iout lower than Isetpoint, then the duty cycle of PWM (Pulse-Width Modulation) pulses applied to switch 43 increases, until the measured current Iout matches Isetpoint. Otherwise, the duty cylcle on high-side switch 43 decreases. The optional switch 40, when present, is always out of phase with respect to high-side switch 43, in other words, when switch 43 is ON, switch 40 is OFF and vice-versa. The optional switch 40 replaces diode 44 and is operative to reduce forward voltage losses which are rather significant on diode 44. The Buck converter with optional switch 40 is known as synchronous Buck converter.

In addition, discharging stage 18 including converter 30 may be provided with a voltage control circuitry, such as controller 37, operative to monitor a capacitor voltage Vc. The control circuitry is configured to turn off converter 30 if the measured voltage drops close to the pump diode output voltage Vout.

The limitations imposed on capacitor voltage Vc are the subject to its relationship with input and output voltages. In FIG. 3, the voltage Vc across capacitor 38 should be higher than both the source voltage Vps (Vc>Vps) and the output voltage Vout on diodes 45 (Vc>Vout). Accordingly, the only limitations applied to system 10 of FIG. 3 include intrinsic limitations of the components of the circuitry.

A start-up is a stressful time for power supply 12, the output current may jump up to the overcurrent limit, because the diode 34 is forward biased during a start-up. To ramp the power supply at a slower rate, system 10 may have a soft start circuit. For example, it may be a MOSFET. Alternatively, it may be a resistor 31 and a switch 33 shunting the resistor. A controller 35 is configured to measure the current through the current limiting element, such as resistor 31. As this current drops below a reference value, controller 35 is operative to close switch 33 so as to have the current flow through the closed switch, and to enable the converter's charging stage.

Figure 5:
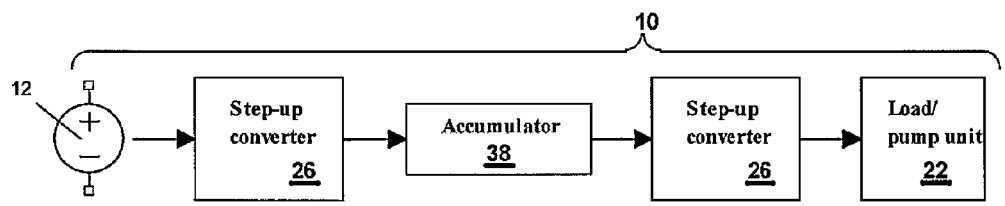
FIG. 5 is a modification of the schematic of FIG. 3.

FIG. 5 illustrates another modification of the embodiment of FIG. 3. In particular, system 10 is configured with two step-up converters 26 each having, for example, a boost configuration. Similarly to FIG. 3, the accumulator is configured as capacitor 38 coupled between the converters. The voltage Vc at the capacitor should be higher than the source voltage Vps and lower than the voltage Vout at pump unit 22 (Vps<Vc<Vout). In accordance with the concept of the disclosed system, the energy stored on the capacitor is a function of the difference between voltages across the capacitor at the beginning and end of the pulse Iout, respectively.

Figure 6:
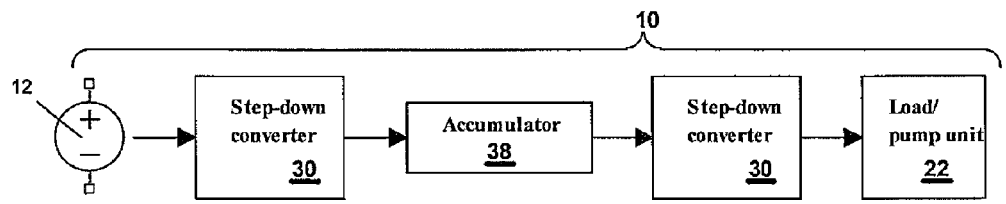
FIG. 6 is another modification of the schematic shown in FIG. 3.

FIG. 6 illustrates a further modification of the above-disclosed embodiment of system 10. Here two step-down converters 30 are coupled to respective input and output of capacitor 38. In contrast to the configuration of FIG. 5, the voltage Vc across capacitor 38 should be lower than the voltage Vps at the output of the power source and greater than the voltage Vout at pump 22 (Vps>Vc>Vout).

Figure 7:
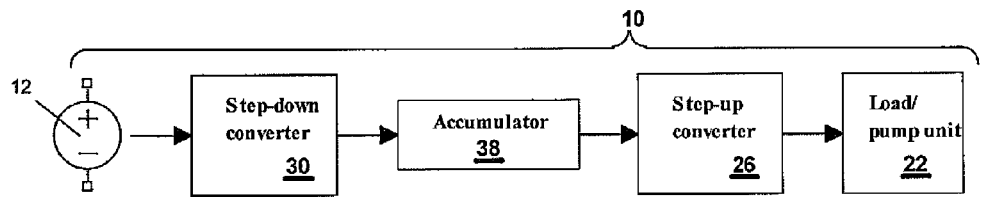
FIG. 7 is still another modification of the schematic of FIG. 3.

FIG. 7 illustrates still a further modification of circuitry of FIG. 3. The system 10 is configured with step-down converter 30 coupled to the output of the power source and step-up converter 26 coupled to the input of pump 22. The capacitor 38 is coupled between respective converters 30 and 26. In this configuration, capacitor voltage should be lower than both Vpc at the output of the power source and Vout at the input of pump 22 (Vc<Vps and Vc<Vout).

Figure 8:
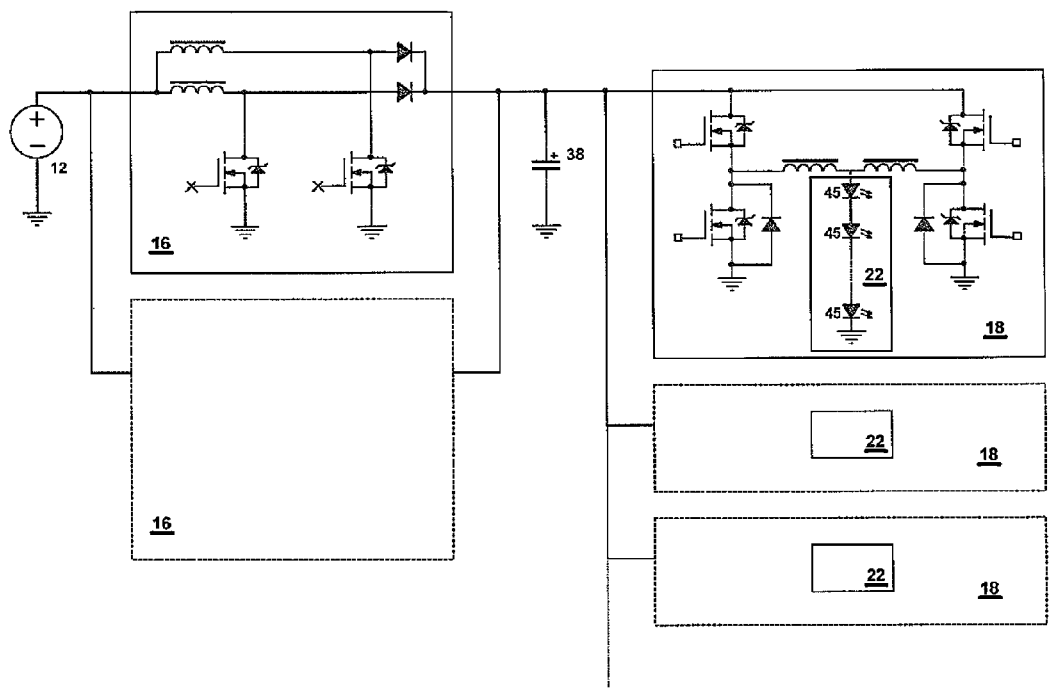
FIG. 8 is an exemplary schematic of the disclosed system configured in accordance with the one embodiment.

FIG. 8 illustrates an example the disclosed laser system which includes multiple converter units 14 configured in accordance with one of the schemes of FIGS. 3, 5-7. The system includes a single two- or more phase charging stages 16 and three two-phase discharging stages 18. The multi-phase charging stage 16 effectively reduces the input current ripple.

The discharging stages 18 each are loaded on a string of pump diodes 22. The two high-side switches of discharging stage 18 are phase-shifted at a 180° angle relative to one another. Such a configuration effectively reduces a ripple current on the pump diodes. In addition, three two-phase discharging stages 18 are shifted at a 120° angle relative to one another. Although the phase-shift between discharging stages 18 does not result in the reduction of the ripple current through the pump diodes, since each stage 18 is coupled to its string of diodes, it certainly affects the optical ripple reduction, because all the pump diodes are optically coupled to the same laser system.

The modification of the system shown in FIG. 8 may include, for example, six (6) single-phase discharging stages 18 each loaded on a string of diodes 22. All six stages 18 are shifted at a 60° angle relative to one another to effectively reduce the optical ripple described above. This configuration functions as if a switching frequency were six times greater. Taking into account the reaction time of the active fiber itself, the final optical noise which is measured at the output of the laser system and associated with the fundamental switching frequency of the discharging stages 18 can be reduced to negligible values. The charging stage 16 may have the same configuration as that one of FIG. 8. As well understood, stages 16 and 18 each may operate with one or multiple converters/channels.

The scope of the disclosure is not limited to the above-disclosed converter topologies. One of possible DC-DC converters may include the use of a single-ended primary-inductor converter (SEPIC) well known to one of ordinary skill in the switched mode power supplies art. The SEPIC can have configurations allowing the voltage at its output, which is controlled by the duty cycle of the control transistor, to be greater than, less than, or equal to that at its input. Accordingly, returning to FIG. 2, both converters 16 and 18 may have the topology of the SEPIC. Still another DC-DC converter may be based on a Cuk topology which, like that of the SEPIC may have an output voltage either greater than or less than the input voltage. Finally, a buck-boost topology also can be utilized in the DC-DC converter of this disclosure. One of the advantages of the above-referred topologies over standard DC-DC converters of FIGS. 3 and 5-7 includes practically the maximum possible capacitor voltage change within the pulse cycle which leads to high energy light pulses. Still another advantage, because of a wide operating range of the capacitor voltage, a soft-start circuitry may be necessary only in some of the disclosed embodiments.

Figure 9:
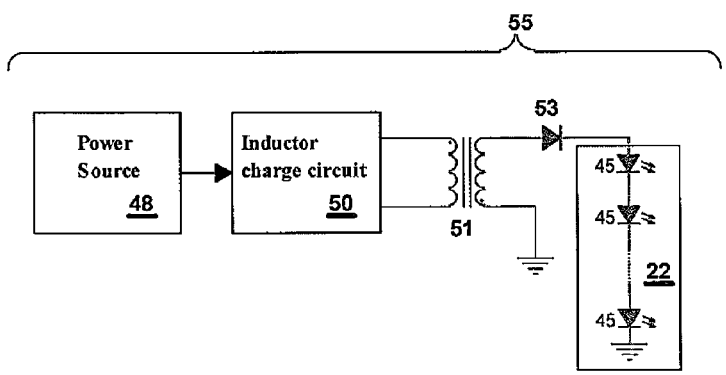
FIG. 9 is a schematic of the disclosed fiber laser system configured in accordance with another embodiment.

FIG. 9 illustrates an alternative embodiment of the disclosed laser system. In particular, laser system 55 includes a power source 48, inductor charge circuit 50, inductor 51, a switch 53 configured for example as a diode and a pump 52 radiating emission which is coupled into a fiber laser unit. The charger circuit 50 is operative to stabilize current in the primary winding of inductor 51 in the following manner. When the current in the primary winding of the inductor 51 is less than a reference value, the input voltage is applied to the primary winding of inductor 51 causing the flow of an increasing magnetizing current. The phasing of the single or multiple secondaries of inductors 51 and switch or rectifier diode 53 is such that the secondary does not conduct during this period. When the primary current reaches the reference value, charge circuit 50 stabilizes the primary current at the reference value. This can be done for example by introducing any limiting element such as a controlled Mosfet, or with the aim of DC/DC technique, or by another solution. Thus, in contrast to a regular transformer, the energy is not immediately transferred, but is accumulating in a core or air gap.

When the system is requested to generate an output pulse, the internal high-speed switch of charge unit 50 turns OFF the primary current, the energy stored in the magnetic field reverses the secondary winding(s) of the inductor 51 which causes the current flow through the forward biased diode 53 into pump diodes. The above-described algorithm is very similar in operation to Flyback-topology known in the DC/DC switching circuits. Similarly to the embodiment disclosed in FIGS. 3 and 5-7, the circuitry of FIG. 9 is operative to first charge the accumulator and then discharge the latter.

The particularity of the disclosed system is that the required current in the secondary winding or windings may or may not be greater than stabilized primary current. Constructively this can be attained by determining the ratio between the number of turns in the secondary and primary windings.

One of the advantages of the system of FIG. 9 over the circuitry of FIGS. 3 and 5-7 includes the fast (microseconds and even nanoseconds depending on the switch design and the configuration of the inductor) current rise in the pulse. Accordingly the situations requiring relative low energy and short duration, the configuration of FIG. 9 may be a preferable solution. A relatively low energy stored in the inductor and linear decay of current in the secondary winding may be considered disadvantageous under certain circumstances if compared to the capacitor-based scheme.

Although the preferred embodiments of the present invention have been described herein, the above description is merely illustrative. The power supply systems disclosed herein are particularly beneficial to fiber laser systems, but may be used for powering a solid state laser systems. Further modification of the invention herein disclosed will occur to those skilled in the respective arts and all such modifications are deemed to be within the scope of the invention as defined by the appended claims.

The invention claimed is:

1. A power supply of a pulsed laser system comprising:
 a DC power source with a source voltage and a source current;
 an energy accumulator in electrical communication with the DC power source;
 a charging DC to DC stage having at least one converter coupled between the DC power source and accumulator and operative to charge the accumulator with a desired energy; and
 a discharging DC to DC stage including at least one converter operative to discharge the accumulator while periodically supplying a diode current with a peak value, which is greater than the source current, to at least one laser diode emitting pump light pulses.

2. The power supply of claim 1, wherein the accumulator includes a capacitor charged with an accumulator voltage which corresponds to the desired energy and is different from both the source voltage and an output voltage at an input of the laser diode, one of the DC to DC converters having a boost topology and the other DC to DC converter having a buck topology.

3. The power supply of claim 2, wherein the charging DC to DC power converter is operative to step up the source voltage to the accumulator voltage, the discharging DC to DC power converter being operative to step down the accumulator voltage so that the accumulator voltage is higher than both the source and output voltage.

4. The power supply of claim 2, wherein the charging DC to DC power converter is operative to step down the source voltage to the accumulator voltage, and the discharging DC to DC power converter is operative to step up the source voltage to the output voltage, wherein the accumulator voltage is lower than both the source voltage and the output voltage.

5. The power supply of claim 1, wherein the DC to DC converters of respective charging and discharging stages have a uniform topology selected from the group consisting of a boost topology and buck topology, the accumulator being a capacitor charged with an accumulator voltage which corresponds to the predetermined energy and is different from both the source voltage and an output voltage at an input of the laser diode.

6. The power supply of claim 1, wherein the accumulator voltage is greater than the source voltage and lower than an output voltage at an input of the laser diode or lower than the source voltage and higher than the output voltage.

7. The power supply of claim 1, wherein the DC to DC converters of respective charging and discharging stages each are selected from the topology consisting of a buck-boost converter, Cuk converter and SEPIC converter and a combination of these, the accumulator being a capacitor charged with a capacitor voltage which corresponds to the desired energy and is substantially the same as the source voltage and an output voltages at an input of the laser diode or different from the source and output voltages.

8. The power supply of claim 1, wherein the DC to DC converter of the discharging stage has a feedback circuitry operative to read the diode current at an input of the laser diode, compare the read diode current to a reference value and regulate the diode current so as to match the diode current with the reference value.

9. The power supply of claim 1, wherein the discharge DC to DC stage includes a plurality of multiphase stages phase-shifted relative to one another at a first angle and each coupled to a string of laser diodes, the phases of each multiphase stage being phase-shifted at a second angle relative to one another, the multiphase discharge stage being operative to minimize an optical ripple in optical pulses emitted from a gain medium and increase a conversion frequency of electrical pulses into optical pulses.

10. The power supply of claim 9, wherein the discharge second DC to DC stage includes six single-phase discharging stages shifted at a 60° angle relative to one another.

11. The power supply of claim 1, wherein the charging DC to DC stage includes a plurality of multiphase stages configured to reduce electrical ripple in the source current.

12. The power supply of claim 1, wherein the accumulator includes an inductor with single or multiple separated secondaries.

13. The power supply of claim 1, wherein the pump light pulses are periodically coupled into at least one gain medium of the laser system, the gain medium including an active fiber, the laser system having one or more fiber laser components.

14. A method for operating a pulsed laser system, comprising the steps of:
controlling a charging DC-to-DC stage including at least one converter so as to periodically charge an accumulator with a desired energy;
controlling a discharging DC-to-DC stage including at least one converter so as to periodically convert the desired accumulator energy to electrical pulses with a peak current greater than a power source current; and
applying the electrical pulses to a pump, thereby radiating high power optical pulses which are coupled into a gain medium of the laser system.

15. The method of claim 14, wherein controlling the charging DC to DC converter includes stepping-up a source voltage to an accumulator voltage Vc corresponding to the desired energy, whereas the discharging DC to DC converter lowers the accumulator voltage to the output voltage.

16. The method of claim 14, wherein the charging and discharging DC to DC converters have a uniform topology selected from the group consisting of a boost topology and buck topology which are operative to either
sequentially increase the source voltage to an accumulator voltage corresponding to the desired energy and further to an output voltage at an input of the laser diode, or
sequentially decrease the source voltage to the accumulator voltage and further to the output voltage.

17. The method of claim 14, wherein controlling the charging DC/DC converter includes stepping-down the source voltage to an accumulator voltage Vc corresponding to the desired energy, whereas the discharging DC/DC converter further lowers the accumulator voltage to the output voltage.

18. The method of claim 14 further comprising measuring the peak actual current at an input of the pump and comparing the measured diode current to a reference value so as to regulate the diode current for matching with the reference value.

19. The method of claim 14 further comprising arranging laser diodes of the pump in a single or multiple branches and coupling pump radiation into the laser system, wherein the laser system is configured with one or more fiber laser components.

* * * * *